United States Patent [19]

Keep

[11] Patent Number: 4,978,569

[45] Date of Patent: Dec. 18, 1990

[54] PROCESS FOR PREPARING SELECTIVELY METALLIZED ARTICLES

[75] Inventor: Gerald T. Keep, Kingsport, Tenn.

[73] Assignee: Eastman Kodak Company, Rochester, N.Y.

[21] Appl. No.: 393,427

[22] Filed: Aug. 14, 1989

[51] Int. Cl.$^5$ .......................... B44C 1/22; B05D 5/12; B05D 3/04; B29C 37/00

[52] U.S. Cl. .................... 428/209; 156/651; 156/668; 156/902; 252/79.1; 252/79.2; 252/79.5; 427/98; 427/306; 427/307; 428/458; 428/901

[58] Field of Search ............... 156/651, 654, 655, 668, 156/902; 174/68.5; 252/79.1, 79.2, 79.5, 79.4; 427/96, 98, 304, 305, 306, 307; 428/601, 209, 323, 324, 325, 458, 463, 474.4, 901

[56] References Cited

U.S. PATENT DOCUMENTS

| | | | |
|---|---|---|---|
| 3,758,332 | 9/1973 | Dinella et al. | 156/668 X |
| 4,457,951 | 7/1984 | D'Amico et al. | 427/96 |
| 4,520,067 | 5/1985 | Harris et al. | 428/323 |
| 4,554,182 | 11/1985 | Bupp et al. | 427/304 |
| 4,592,929 | 6/1986 | Tubergen et al. | 427/98 |
| 4,594,311 | 6/1986 | Frisch et al. | 430/315 |
| 4,601,783 | 7/1986 | Krulik | 156/655 |
| 4,610,895 | 9/1986 | Tubergen et al. | 427/98 |
| 4,775,557 | 10/1988 | Bastenbeck et al. | 427/307 |

*Primary Examiner*—William A. Powell
*Attorney, Agent, or Firm*—John F. Stevens; William P. Heath, Jr.

[57] ABSTRACT

Disclosed is a process for preparing a selectively metallized article, and to the article prepared by this process. The process comprises:

1. swelling a polymeric article with dimethylformamide for a length of time of 1 to 5 minutes;
2. treating the polymeric article with an aqueous solution of a strong base;
3. alternately repeating steps 1 and 2 any number of times;
4. etching said polymeric article;
5. subjecting polymeric article to electroless copper plating, to obtain said selectively metallized article.

12 Claims, No Drawings

PROCESS FOR PREPARING SELECTIVELY METALLIZED ARTICLES

BACKGROUND OF THE INVENTION

1. Field of the Invention

The present invention relates to a process for producing selectively metallized articles, e.g., molded printed circuit boards and other selectively conductive molded articles. A unique etching procedure is provided in which the solvent swelling step used in conventional procedures is alternated with exposure to a caustic solution to improve adhesion of metal deposits to the articles.

2. Discussion of the Background

Circuit boards are widely used in the electrical industry for radio, television, computers, appliances, industrial and electronic equipment. Printed circuit boards have been traditionally manufactured from a copper clad epoxy-glass laminate.

When starting with this material the shape of the printed circuit board must first be routed out and the holes for mounting the components (e.g., transistors, resistors, integrated circuits, etc.) individually drilled. The board is then masked with photoresist, the circuitry imaged, and the copper etched away from areas where it is not wanted.

An alternative to this procedure is to injection mold the circuit board substrate with the holes in place or even with parts such as clips and bosses as an integral part of the molded article. The molded substrate is then put through several adhesion promotion steps and plated with electroless metal according to standard technology, to produce the printed circuit board. In this case the substrate material is limited to thermoplastic resins with sufficient thermal stability and chemical properties to survive wave soldering. Savings may result with these injection molded circuit board substrates due to the elimination of considerable mechanical processing such as routing and drilling.

The critical parameters of a printed circuit board, from a soldering standpoint, are its heat deflection temperature, environmental stress crack resistance and thermal expansion coefficient. The higher a substrate's heat deflection temperature and environmental stress crack resistance to solder fluxes, the less likely it will blister or delaminate during soldering.

Methods for the electrochemical and electroless deposition of copper and other conductive metals onto activated substrates are well known and defined in the art and will not be detailed herein. Methods for manufacturing planar printed circuit boards from metal/resin laminates by subtractive etching of the copper are also well documented in the art.

The image of the circuit trace can be obtained by various methods known in the art, including use of resists before or after initial metal plating, or by overmolding with a noncatalytic resin as disclosed in European Patent Application Nos. 0 256 428 and 0 192 233. In these cases, it is necessary to etch the material both to promote good adhesion and to expose the catalytic particles, which are generally remote from the original molded surface of the device.

The demand for nonconductive moldable materials that will accept electroless deposits of metal is clear. In common to all of the above techniques of electroless metal deposits is the need to etch, adhesion promote, or otherwise modify the surface of such a molded part.

Many techniques for chemical etching of thermoplastics are disclosed in the literature, including U.S. Pat. Nos. 4,457,951, 4,592,929, 4,595,451, 4,601,783, 4,610,895, 4,592,852 and 4,629,636. In general, these techniques require the material to be wet or penetrated by reagents or solvents.

Alternative methods, which utilize plasmas, as in U.S. Pat. Nos. 4,337,279 and 4,402,998 are more expensive and difficult to carry out, as well as exhibiting some difficulties with uniform etching and penetration into holes. For these reasons, chemical etching methods involving solvent penetration into the material are preferred.

Available materials are limited in scope by this need for chemical attack, which is usually dependent on penetration of a solvent into the material. This is best accomplished with an amorphous polymer, which typically has a low solvent resistance, as compared to a semicrystalline polymer. Thus, most common polymers used in the art for molded circuit boards, polyethersulfone (PES) and polyetherimide (PEI), are amorphous polymers.

There are many advantages to be gained by the use of semicrystalline polymers. A property of prime importance in the field of molded circuit boards is a high Heat Deflection Temperature (HDT), since in many cases it is desirable to solder electrical components onto these devices, generally at temperatures in the range of 230° to 290° C. HDT is measured via ASTM D648, however, tests for dimensional stability of the molded parts in these temperature ranges are the standard by which sufficiently "high HDT" is judged.

For an amorphous polymer this requires a very high glass transition temperature, Tg, which restricts the available polymers to an elite group. These polymers are typically expensive, require high processing temperatures, and have very poor flow characteristics.

Semicrystalline polymers, on the other hand, can be compounded with glass fibers or other fillers to give a HDT determined more by their Tm (melting temperature) rather than their Tg. Generally, at least about 10% glass fiber is needed. This results in much higher HTD's than would otherwise be indicated by their melt viscosities and processing temperatures of these polymers, and would allow for the use of much less expensive polymers with lower processing temperatures and good flow characteristics.

For example, poly(cyclohexylenedimethylene terephthalate) (PCT) can withstand total immersion in a 260° C. solder bath for a full minute with little ill effect. In contract, PES, which has a similar processing temperature, a higher melt viscosity, and higher cost, has a Tg about 40 degrees below 260° C.

Semicrystalline polymers clearly would be competitive in both cost and HDT, if they could be made to accept electroless metal plating with good adhesion.

Thus, there remains a need for a method for increasing the adhesion of deposits of electroless metal plating onto a molded article, particularly when the molded part comprises at least some semicrystalline polymers.

DESCRIPTION OF THE INVENTION

The present invention provides a method for forming selectively conductive molded articles or substrate from polymers using a unique etching procedure which improves adhesion of the deposit of metal onto the molded article.

The inventor has now discovered that improved adhesion of the metal plating to a molded plastic article can be achieved by alternating the conventional solvent swelling step with exposure to a caustic solution.

Conventional electroless plating procedures include first exposing the substrate to one solvent to swell the surface, followed by a conventional etching procedure. Conventional etching procedures commonly include subjecting the substrate to an oxidizing or reducing solution such as chromic acid dissolved in sulfuric acid or a caustic permangate, followed by neutralization, and washing(s) which may include weak neutralizing agents, surfactants, etc., prior to plating.

According to the present invention, a polymeric substrate is selectively metallized by:
(a) swelling a polymeric substrate which is susceptible to attack by an organic solvent with an organic solvent for a length of time of about 1–5 minutes;
(b) contacting the substrate with an aqueous solution of a strong base or a strong acid to stress-crack the substrate;
(c) alternately repeating steps (a) and/or (b) any number of times
(d) etching the substrate; and
(e) subjecting the substrate to electroless metal plating to obtain said selectively metallized article.

Thus, according to the present invention, swelling and stress cracking are repeated for any suitable number of times, ending with either step, prior to conventional etching and plating.

The present invention is of particular interest in connection with molded thermoplastic circuit boards.

The polymeric substrate may be of any polymer which is susceptible to attach by strong acid or strong base. Preferably, the polymer is a polyester, and most preferably the polymer is a blend of an amorphous polymer with a semicrystalline polyester, such as a blend of polyethersulfone [PES]with poly(1,4cyclohexylenedimethylene terephthalate) [PCT].

The polymers are of a molecular weight so they are injection moldable. In the case of polyester, the inherent viscosity (I.V.) is about 0.5–1.0 as measured at 25° C. using 0.5 grams of polymer per 100 mL of a solvent consisting of 60% by weight phenol and 40% by weight tetrachloroethane.

The words "amorphous" and "crystalline" used in this text either refer to a material's inherent ability to crystallize when referring to a material type, or alternatively its current state of crystallinity for a semicrystalline material when referring to a particular object, depending on context. Preferably, the composition of the substrate is a blend of amorphous and semicrystalline polymer to realize the advantages of both. For the purpose of this document, the term "semicrystalline" is used to indicate a material that is capable of some substantial degree of crystallinity (i.e. materials capable of being prepared without crystallinity and which may be made to contain up to 40% crystallinity). Thus, in this manuscript, the term "Semicrystalline" refers to materials which are capable of being prepared without crystallinity but which can be modified to contain up to 60% crystallinity. Normally, the preferred amount of crystallinity in the semicrystalline polymer is about 10–50% as measured by techniques known in the art. For example, see Journal of Applied Polymer Science, Vol. 33, pp 29–39 (1987) "Annealing Effects on the Crystallinity of Polyetheretherketone (PEEK) and its Carbon Fiber Composite" and Polymer Science U.S.S.R. Vol. 28, No. 1, pp 113–119, (1986) "The Determination of Crystallinity of New Polymers (Polyimides and Other Polyheteroarylenes)". Differential Scanning Calorimetry techniques are also useful in determining crystallinity, as is known in the art. The term "amorphous thermoplastic" refers to materials which are incapable of being made to contain any crystallinity.

The words "mold" or "molded" herein refer generically to any method of shaping a thermoplastic material including but not limited to injection and compression molding, extrusion and pultrusion, pressing, stamping, thermoforming, and rotational molding.

Although conventional semicrystalline or amorphous polymer may be used, the etching process of the present invention is particularly useful when the polymeric article is a blend of semicrystalline and amorphous polymer, which combine the physical properties of the semicrystalline polymer with the low solvent resistance of the amorphous polymer. Thus, in a preferred embodiment the of the present invention, a blend of 1 to 99 wt % of a semicrystalline polymer and from 99 to 1 wt % of an amorphous polymer are used in the process.

Preferably, if the amorphous thermoplastic component is miscible in the semicrystalline thermoplastic component, the amorphous thermoplastic component is used in an amount of from 1 to 99 wt % of the composition, most preferably in an amount of from 1 to 25 wt % of the composition.

If the amorphous thermoplastic component is not miscible in the semicrystalline thermoplastic component, the amorphous thermoplastic component is used in an amount of from 5 to 99 wt % of the composition, preferably in an amount of from 5 to 85 wt %.

The blend is molded under conditions that minimize crystallinity, then swollen with organic solvent, etched, and finally annealed to recovered the desired crystallinity and HDT.

In the context of the present invention, any metal which can be electroless plated may be plated on the polymeric substrates. Preferably, the metal is copper or nickel. Most preferably, the metal is copper.

In accordance with the present invention, a moldable and etchable polymer is first swollen with an organic solvent. The length of this swelling operation may be from 1 to 5 minutes giving the solvent time to penetrate. It is carried out at a temperature at which the solvent is either liquid or gaseous, but preferably the swelling operation is carried out at a temperature between the melting point and boiling point of the solvent.

The polymer is then treated with a stress-cracking agent, for instance an aqueous solution of a strong base or strong acid or a second solvent that attacks the polymer. Strong bases which may be used include NaOH, KOH, NH$_4$OH, Ca(OH$_2$), and Mg(OH)$_2$. Strong acids which may be used include sulfuric, hydrochloric, etc. The strong base or strong acid is preferably an aqueous solution of about 5–25 %, resulting in a pH of about 10 or above in the case of strong base or about 4 or below in the case of strong acid. The cracking agent only requires full contact and temperature equilibration.

The step of contacting the polymer with a solvent is repeated. Preferably, the sequence of contact with strong acid or strong base followed by contact with solvent is repeated.

The resin is then etched and subsequently subjected to electroless copper plating to obtain a selectively metallized article. This selectively metallized article may be a circuit board.

Preferably, the polymer is then treated with a wetter (surfactant) solution, and then treated with an acid rinse solution. The thus-obtained resin is then etched with an etching solution and then subjected to electroless copper plating to obtain the selectively metallized article.

In this invention one uses a process characterized by interspersing short periods of solvent exposure with periods of exposure to aqueous solutions of a strong acid or strong base. It is believed that this causes microcracking of the plastic surface and allows deeper penetration of the plastic part by the solvent. This surprisingly leads to an improved adhesion of the final electroless copper to the molded part.

The aqueous solution should be fairly strong, generally containing from about 50 g/l to about 200 g/l of strong base. The temperature of the solution should be maintained at as high a temperature as is allowed by evaporative loss.

After the final solvent exposure, the normal sequence of wetter (surfactant), acid, rinse, and chrome is followed.

Examples of solvents which may be used include dimethylformamide, methanol, (MeOH), methylene chloride ($CH_2Cl_2$), methylethyl ketone (MEK), 1,3-dichloroisopropanol, ethylacetate, butylacetate, toluene, orthodicholoro-benzene, $\gamma$-butyrolactone, dimethylphthalate and cyclohexane.

At the end of the preparation, the material is annealed to recover the desired crystallinity in HDT. Since the crystallization of the material will determine its HDT, the annealing procedure is applied until crystallization. However, variations on this procedure are possible.

Electroless metal plating is then used and allows the fabrication of selectively conductive molded devices with superior HDT at a lower cost.

In one preferred embodiment, the semicrystalline polymer used is poly(cyclohexylene dimethylene terephthalate) (PCT), a polyester having repeat units from terephthalic acid and 1,4-cyclohexanedimethanol, due to its ready availability and high HDT of its glass fiber reinforced composites which is in excess of 260° C. Poly(ethylene terephthalate) (PET), a polyester having repeat units from terephthalic acid and ethylene glycol, may also be used but with a lower cost and HDT than PCT. Other semicrystalline polymers such as other polyesters (including poly(butylene terephthalate)), polypropylene, crystalline polyamides, poly(phenylene sulfide) and so forth may also be used.

The amorphous polymers which may be used include polyethersulfone (PES), polysulfone (PS), polyetherimide (PEI), polyetheretherketone (PEEK) or polyarylate (PA), e.g., a copolymer of bisphenol A with either isophthalic acid, terephthalic acid, or a mixture of terephthalic and isophthalic acids.

PES may be used in an amount of from 5 to 85% of the resin, with an ideal range of 15 to 25%. Another good choice is PA (ARDEL D-100) which is more effective at quenching PCT, allowing for the use of a smaller percentage of PA, which counterbalances the lower intrinsic HDT of this material. PA can be used in an amount of from 1 to 25% of the resin, with preferred range 5 to 15%. Blends including all three polymers in the above ranges may also be used.

As noted supra, recent developments in the art include the use of features in molded circuit boards. One example is a molded-in pattern of recesses which, when the raised portions are coated with a resist or are selectively metal plated, define the circuit traces, as is disclosed in U.S. Pat. Nos. 4,532,152, 4,651,417 and 4,668,603.

It is immaterial to the present invention, however, whether the resist is to be applied before or after the initial plating of copper and whether portions of the plated copper must be later etched away.

As also noted supra, a wide number of citations in the literature involve imaging the circuit traces by selective deposition of metal particles followed by electroless plating of a metal. These include U.S. Pat. Nos. 3,629,922, 3,722,056, 3,772,078, 3,907,621, 3,930,963, 3,959,547, 3,993,802, 3,994,727, 4,511,597, 4,594,311 and 4,666,739.

Whether the image is formed mechanically or photolithographically is immaterial to the present invention. In these techniques, it is important to adhesion promote the surface of the item to be plated in order to get good mechanical adhesion of the electroless metal deposit.

In all cases, it is recognized in the art that thermoplastic formulations can include minor additives to affect such properties as color, flame retardancy, oxidative stability, crystallization characteristics, impact and other mechanical properties, and so forth. In the present invention, all formulations allow such variations of additives in accordance with the art.

The blends may thus contain other ingredients such as stabilizers, i.e., metal oxides such as zinc oxide, antioxidants, flame retardants, pigments, fibers, inorganic fillers, and the like. Preferably, the composition contains fibers and/or inorganic fillers.

The reinforcing fiber includes fiberglass, carbon fibers, and the like, and mixtures thereof. The particulate inorganic fillers which may be used include wollastonite, calcium carbonate, glass beads, talc, mica and the like, or mixtures thereof.

The fiber reinforcement, filler or combinations thereof, is utilized in amounts of from 10 to about 50 weight percent, preferably from about 10 to about 35 weight percent.

The nature and amount of noncatalytic fillers in particular such as glass, mica, talc, etc., is irrelevant to the etching and plating characteristics of the material and will be selected based on other concerns. Generally, some filler such as glass fibers needs to be present to attain high HDT's in semicrystalline materials.

In some cases, portions of flame retardants (e.g., brominated polystyrenes), rubbery impact modifiers, and the like may be considered an amorphous polymeric component and will behave as disclosed in this invention and will be relevant to the invention as disclosed.

Clearly, many different combinations of compatible and incompatible amorphous polymers may be incorporated into these polymer blends to manipulate the scale and texture of the resultant etch surface. This principle is applicable to any polymer which is difficult to etch.

The choice of whether to include the electroless plating catalyst in the material formulation or whether to deposit it on the surface of the molded articles is a matter of convenience. The adhesion promotion requirements of the two cases do not differ substantially and so this choice is immaterial to the invention.

An extreme application of this invention would utilize a polymer blend with more of the amorphous component than of the semicrystalline material. Such a blend would etch very similarly to the amorphous component alone, yet would hold the advantages of reduced cost, improved HDT, and, in many cases, reduced melt viscosity for easier molding operations.

The following examples are submitted for a better understanding of the invention.

The following thermoplastic formulations referred to in the examples are compounded on a single-screw extruder and injection molded from a 310° C. melt into a 23° C. mold. No drying is done before treatment, in order to prevent crystallization of the PCT.

Blend A - 46.9% PCT, 20.1% PEI, 30% PPG 3450 ⅜" glass fiber, 3% CAT-10.
Blend B - 61% PCT, 26% PES, 10% GF, 3% CAT-10.
Blend C - 42.8% PCT, 18.2% PES, 20% GF, 3% CAT-10, 12%
Great Lakes P064P, 4% Thermoguard FR.
Blend D - 54% PCT, 23% PES, 20% GF, 3% CAT-10.
Blend E - 52.75% PCT, 24% PES, 20% GF, 3% CAT-10, 0.25% Irganox 1010.

Note: In the above blends, PCT=poly(1,4-cyclohexylenedimethylene terephthalate), PEI=ULTEM 1000 poly(etherdimide), PES=Victrex 3600G polyethersulfone, CAT-10 is a catalytic powder from Johnson-Matthey, and GF refers to Owens Corning 492AA ⅛" chopped glass fiber.

The metal is deposited using MacDermid's Mac-U-Dep 52 electroless copper and thickened by electroplating from an acid bath then peeled by hand at 90° to the surface. Peel strengths are measured with a Chatillon Dial Push-Pull Gauge Model DPP-5. Several measurements along the length of the bar are taken and an average and standard deviation reported.

EXAMPLE 1

Blend A is immersed in a series of solutions:
(i) 2 minutes of 10% MeOH in $MeCl_2$ at 36±1° C., then 2 minutes of 100g/l NaOH at 69.5±2° C.,
(ii) as above, but contacted with solvent, then caustic, then solvent,
(iii) as above but alternately contacted with solvent, -caustic, -solvent, -caustic,
(iv) As above but alternately contacted with solvent, -caustic, -solvent, -caustic, -solvent Samples are rinsed but are not exposed to the usual chromium etching.

Examination by SEM show successively greater amounts of cracking and pitting of the samples. The samples accept electroless copper plating, but in general show poor adhesion.

EXAMPLE 2

Blend B is swollen and etched using two different solvents, ethyl acetate (EA) and butyl acetate (BA), both with and without alternating the solvent with 100g/1NaOH solution (Caustic). EA is at 61±2° C., BA is at 70±6° C., Caustic is at 67±1° C. The No Caustic case is 6.75 minutes exposure to the solvent, while the Caustic case is 2 minutes each of solvent, caustic, solvent, caustic, then solvent (6 minutes of total solvent exposure time). Samples are otherwise treated in conventional manner. Peel strengths are measured as plated, and after 150° C. anneal overnight.

The samples treated with caustic show clearly superior peel strengths, as shown in Table 1.

TABLE 1

| | Example 2. Peel Strengths (pounds/inch) | | | |
|---|---|---|---|---|
| | Treatment | | | |
| | Ethyl Acetate | | Butyl Acetate | |
| | No Caustic | Caustic | No Caustic | Caustic |
| As-plated | 1.06 ± .09 | 1.8 ± .3 | 0.8 ± .2 | 1.37 ± 1.3 |
| Annealed | 2.04 ± .10 | 2.40 ± .12 | 1.1 ± .2 | 1.88 ± .04 |

EXAMPLE 3

Blends C and D are treated as in Example 2, but using six different solvents at 66±4° C. In the no caustic cases, solvent exposure time is 6 minutes even. Caustic temperature is 64±3° C.

Samples treated with caustic have higher peel strengths in almost all cases, or else are within the error of the measurements. Peel strengths Table 1, Example 3, Peel Strengths (pounds/inch)

TABLE 1

| | Example 3, Peel Strengths (pounds/inch) | | | |
|---|---|---|---|---|
| | Blend C | | Blend thalate | |
| | No Caustic | Caustic | No Caustic | Caustic |
| Ethyl Acetate | | | | |
| As-plated | .96 ± .09 | 1.6 ± .4 | .44 ± .14 | .74 ± .15 |
| Annealed | 1.0 ± .3 | 1.84 ± .18 | .55 ± .17 | 1.0 ± .15 |
| Butyl Acetate | | | | |
| As-plated | .5 ± .3 | 1.0 ± .3 | .41 ± .09 | .7 ± .4 |
| Annealed | .41 ± .13 | 1.4 ± .5 | .66 ± .08 | .7 ± .3 |
| Toluene | | | | |
| As-plated | .5 ± .4 | .47 ± .16 | .35 ± .10 | .59 ± .16 |
| Annealed | .5 ± .3 | .71 ± .13 | .36 ± .06 | .7 ± .2 |
| o-Dichloro-benzene | | | | |
| As-plated | .42 ± .04 | .53 ± .17 | nt | nt |
| Annealed | .7 ± .5 | .7 ± .5 | .3 | nt |
| Cyclohex-anone | | | | |
| As-plated | .44 ± .17 | .7 ± .5 | .26 ± .10 | .3 |
| Annealed | .35 ± .05 | .9 ± .5 | .22 ± .04 | .23 ± .05 |
| Dimethylph-thalate | | | | |
| As-plated | .41 ± .18 | .40 ± .03 | .19 ± .04 | .27 |
| Annealed | .33 ± .06 | .30 ± .03 | .23 ± .05 | .24 |

EXAMPLE 4

Blend E is treated as in Example 3 but with room temperature (24°±1° C.)Cyclohexanone as the solvent. Samples are treated either with no caustic, 25° C. caustic (cold) or 66° C. caustic (hot). Samples treated with caustic give higher peel strengths than samples treated with no caustic, while hot caustic is more effective than cold in improving peel strength, as can be seen from Table 3.

TABLE 3

| | Example 4, Peel Strengths (pounds/inch) | | |
|---|---|---|---|
| | No Caustic | Cold Caustic | Hot Caustic |
| As-plated | .20 ± .02 | .37 ± .02 | .56 ± .02 |
| Annealed | no test | .56 ± .04 | .81 ± .06 |

Obviously, numerous modifications and variations of the present invention are possible in light of the above teachings. It is therefore to be understood that within the scope of the appended claims, the invention may be

I claim:

1. Process for producing a selectively metallized article comprising
    (a) contacting a polymeric substrate with an organic solvent for said polymeric substrate for a time sufficient to swell the surface of said substrate,
    (b) contacting said substrate with an aqueous solution of a strong base or strong acid for a time sufficient to stress-crack the substrate,
    (c) repeating step (a) or steps (a) and (b) any number of times,
    (d) etching the substrate, and
    (e) electroless plating said substrate to obtain a selectively metallized article.

2. Process according to claim 1 in which the time of contact with said organic solvent is about 1-5 minutes and the time of contact with said strong acid or strong base is sufficient for full contact and temperature equilibration.

3. Process according to claim 1 wherein said organic solvent is dimethylformamide, methanol, methylene chloride, methylethyl ketone, 1,3-dichloroisopropanol, ethylacetate, butylacetate, toluene, orthodichlorobenzene, $\gamma$-butyrolactone, dimethylphthalate and cyclohexane.

4. Process according to claim 1 wherein said aqueous solution in step (b) is of a strong base.

5. Process according to claim 1 wherein said polymeric substrate comprises about 1-99 wt % of an amorphous polymer and about 99-1 wt % of a semicrystalline polymer.

6. Process according to claim 5 wherein said semicrystalline polymer is poly(cyclohexylene dimethylene terephthalate), poly(ethylene terephthalate) or poly(butylene terephthalate).

7. Process according to claim 5 wherein said amorphous polymer is polyarylate, polyethersulfone, polysulfone or polyetherimide.

8. Process for producing a selectively metallized article comprising
    (a) contacting a polymeric substrate with an organic solvent selected from the group consisting of dimethylformamide, methanol, methylene chloride, methylethyl ketone, 1,3-dichloroisopropanol, ethylacetate, butylacetate, toluene, orthodichloro-benzene, $\gamma$-butyrolactone, dimethylphthalate and cyclohexane, for a time of about 1-5 minutes, said polymeric substrate comprising a blend of about 1-99 wt % of a semicrystalline polymer and about 99-1 wt % of an amorphous polymer,
    (b) contacting said substrate with an aqueous solution of a strong base, said solution having a pH of 10 or higher, to stress-crack said substrate,
    alternatively repeating steps (a) and/or (b) any (c) etching said substrate, and
    (d) electroless plating said substrate to form a selectively metallized article.

9. A selectively metallized article produced by the process of claim 1.

10. A selectively metallized article produced by the process of claim 8.

11. A selectively metallized circuit board produced by the process of claim 1.

12. A selectively metallized circuit board produced by the process of claim 8.

* * * * *